(12) United States Patent
Ellesgaard et al.

(10) Patent No.: US 7,723,900 B2
(45) Date of Patent: May 25, 2010

(54) ELECTRO-MECHANICAL WAVE DEVICE

(75) Inventors: Henning Ellesgaard, Væriose (DK);
Elvind Johansen, Alsgarde (DK); Tom Olesen, Goriose (DK); Henrik Andersen, Skibby (DK); Morten Hartvig Hansen, Roskilde (DK)

(73) Assignee: PCB Motor APS, Hillerod (DK)

( * ) Notice: Subject to any disclaimer, the term of this patent is extended or adjusted under 35 U.S.C. 154(b) by 0 days.

(21) Appl. No.: 12/091,839

(22) PCT Filed: Oct. 27, 2006

(86) PCT No.: PCT/DK2006/000595

§ 371 (c)(1),
(2), (4) Date: Jul. 2, 2008

(87) PCT Pub. No.: WO2007/048412

PCT Pub. Date: May 3, 2007

(65) Prior Publication Data

US 2008/0309193 A1 Dec. 18, 2008

(30) Foreign Application Priority Data

Oct. 28, 2005 (DK) ................................ 2005 01499

(51) Int. Cl.
*H01L 41/08* (2006.01)
(52) U.S. Cl. ............................ 310/323.04; 310/323.06; 310/323.11
(58) Field of Classification Search .................. 310/323, 310/2–5
See application file for complete search history.

(56) References Cited

U.S. PATENT DOCUMENTS

| | | | | |
|---|---|---|---|---|
| 4,634,916 A * | 1/1987 | Okada et al. | ............ | 310/323.03 |
| 4,771,203 A * | 9/1988 | Mukohjima et al. | ..... | 310/323.05 |
| 4,937,488 A * | 6/1990 | Fujie et al. | ............. | 310/323.03 |
| 5,172,023 A * | 12/1992 | Kawai et al. | ........... | 310/323.04 |
| 5,237,236 A * | 8/1993 | Culp | .......................... | 310/317 |
| 5,471,108 A | 11/1995 | Guyomar et al. | | |
| 5,554,905 A * | 9/1996 | Gschwind et al. | ....... | 310/323.02 |
| 5,632,074 A * | 5/1997 | Kanazawa | .................. | 29/25.35 |
| 6,066,911 A * | 5/2000 | Lindemann et al. | .... | 310/323.02 |
| 2001/0022485 A1 | 9/2001 | Oda et al. | | |
| 2004/0174773 A1 | 9/2004 | Thomenius et al. | | |

FOREIGN PATENT DOCUMENTS

EP 0 569 673 A1 11/1993

(Continued)

OTHER PUBLICATIONS

"Citation List for UP10-PA0501 Family", NKT Holding A/S Group IP, One Page.

*Primary Examiner*—Mark Budd
(74) *Attorney, Agent, or Firm*—Merchant & Gould, P.C.

(57) ABSTRACT

An electro-mechanical wave device which may be used for movement of a mechanical member, e.g. by friction, a motor comprising one or more wave devices, and a method of providing the electro-mechanical wave device. The electro-mechanical wave device comprises a substrate comprising a plurality of conductors, and a plurality of actuators positioned on the substrate for generation of mechanical waves along a predetermined propagation path, each of the actuators being connected to a respective set of the conductors of the substrate for reception of an excitation signal transmitted by the set of conductors.

21 Claims, 12 Drawing Sheets

FOREIGN PATENT DOCUMENTS

| | | |
|---|---|---|
| EP | 0 570 673 A1 | 11/1993 |
| EP | 1 009 095 A1 | 6/2000 |
| WO | WO 91/04584 | 4/1991 |
| WO | WO 96/13870 | 5/1996 |
| WO | WO 01/39253 | 5/2001 |

* cited by examiner

ELECTRO-MECHANICAL WAVE DEVICE

The present invention relates to an electro-mechanical wave device which can be used for movement of a mechanical member e.g. by friction and a method for the design and manufacture of the electro-mechanical wave device.

BACKGROUND OF THE INVENTION

Conventional ultrasonic traveling wave motors have been aimed at high-tech applications, where the special features of these motors (e.g. direct drive through high torque at low speed, size-independent efficiency, high power to weight ratio, quiet drive, etc.) have been given higher priority than low production costs. Common designs of the stator in traveling wave motors consist of a single piezoelectric ceramic element attached to a metallic carrier, where the ceramic element is machined to the same shape as the stator, e.g. annular shaped rotating motors. This leads to high production and material costs.

SUMMARY OF THE INVENTION

According to the present invention an electro-mechanical wave device is provided. The electro-mechanical wave device comprising a substrate for propagation of a mechanical wave and for transmission of electrical signals through conductors accommodated by the substrate, a plurality of actuators positioned on the substrate for generation of the mechanical wave, each of the actuators being connected to a set of at least two conductors of the substrate for reception of an excitation signal transmitted by the set of conductors, whereby the actuators are arranged to generate the mechanical wave propagating in the substrate along a predetermined propagation path in response to the excitation signals.

It is an advantage of the present invention that the electro-mechanical wave device has a modular construction where identical components may be used in several different embodiments. For example, the actuators of the device may be standard and low cost components, the number and positions of which are readily adapted to specific application requirements.

It is a further advantage of the present invention that conventional and cost efficient production methods and components may be utilized during the manufacture of the device. For example, the substrate may be constituted by a printed circuit board (PCB) providing the conductors of the device and the mechanical wave carrier, and the production may incorporate standard production methods of the electronics industry.

Preferably, the electro-mechanical wave device is operated in the ultrasonic frequency range, whereby a quiet operation of the device is achieved. Thus, the material and geometry of the substrate is selected in accordance with the physical requirements and the requirement of operation within the ultrasonic frequency range. The material of the substrate may be conventional composites, such as glass/epoxy, or ceramics, such as aluminum oxide, used for printed circuit boards, advanced composites, such as carbon/epoxy, or metal alloys.

The substrate may form a closed loop that has geometrical symmetry about an axis. For example, in house hold equipment and industrial equipment of comparable size, the substrate may be a cylinder or an annular disc having an outer radius R ranging from about 2 mm to about 100 mm, such as from 4 mm to 40 mm, e.g. about 10 mm. The height of the cylinder or the width of the annular disc may range from about 2 mm to about 50 mm, such as from about 4 mm to about 20 mm, e.g. about 5 mm. The wall thickness of the cylinder or the thickness of the annular disc may range from about 0.2 mm to about 10 mm, such as from about 0.5 to about 5 mm, e.g. about 1.5 mm.

In another embodiment, the substrate may form a closed loop that does not have geometrical symmetry about an axis. It is preferred that the wavelength of the traveling wave is smaller than the smallest radius of curvature of the propagation path of the wave, such as an order smaller than the smallest radius of curvature. For example, in house hold equipment and industrial equipment of comparable size, the substrate may be a cylinder with an elliptical cross-section or an elliptical ring shaped disc having a length of the major axis ranging from about 2 mm to about 100 mm, such as from 4 mm to 40 mm, e.g. about 10 mm. The height of the cylinder or the width of the ring shaped disc may range from about 2 mm to about 50 mm, such as from about 4 mm to about 20 mm, e.g. about 5 mm. The wall thickness of the cylinder or the thickness of the ring shaped disc may range from about 0.2 mm to about 10 mm, such as from about 0.5 to about 5 mm, e.g. about 1.5 mm.

In yet another embodiment, the substrate may form an open loop extending from a first end to a second end, for example a linearly extending substrate. The ends of the substrate cause reflections of the traveling wave. The reflections may be suppressed by appropriate control of actuators positioned at the ends for provision of absorbing boundary conditions. It is preferred that the wavelength of the traveling wave is smaller than the smallest radius of curvature of the propagation path of the wave, such as an order smaller than the smallest radius of curvature. For example, in house hold equipment and industrial equipment of comparable size, the distance between the first end and the second end may range from about 5 mm to about 500 mm, such as from about 20 mm to about 250 mm, preferably from about 40 mm to about 100 mm, e.g. about 70 mm. Larger embodiments may also be conceived, e.g. for use in large-sized applications, such as wind turbines, cranes, aircrafts, etc.

For transmission of electrical signals to the plurality of actuators, the substrate comprises a plurality of conductors. Each conductor may be embedded on one or more surfaces of the substrate and/or be integrated in the substrate. The substrate may provide conductors for conduction of individual signals to each of the actuators, or for conduction of signals to different sets of actuators. Preferably, the substrate comprises a first, second and third conductor. Each conductor may be connected to one or more actuators. The first conductor may conduct a first electrical signal for excitation of at least one of the actuators. The second conductor may conduct a second electrical signal for excitation of actuators connected to the second conductor. The third conductor may conduct a third electrical signal, such as a common ground signal for the actuators connected to the third conductor.

The plurality of actuators may be piezoelectric ceramic actuators, or magneto-restrictive actuators. Different types of actuators may be combined. Preferably, the plurality of actuators comprises a plurality of single layer piezoelectric actuators due to their low cost. Multilayer piezoelectric actuators may also be employed.

The actuators may have any suitable shape and size, such as substantially box-shaped having a side length along the direction of polarization from about 0.2 mm to about 10 mm, such as from about 0.5 mm to about 5 mm, from about 0.7 mm to about 2 mm, preferably about 1 mm. Further, the actuators may have a width perpendicular to the direction of polarization from about 0.2 mm to about 10 mm, such as from about 0.5 mm to about 5 mm, from about 0.7 mm to about 2 mm, preferably about 1 mm. Further, the actuators may have a height perpendicular to the direction of polarization from about 0.1 mm to about 5 mm, such as from about 0.2 mm to about 2 mm, preferably about 0.5 mm.

Preferably, each of the actuators is positioned on a first surface of the substrate. However, one or more of the actuators may be positioned on a second surface of the substrate, e.g. half of the actuators may be positioned on a first surface and the other half of the actuators may be positioned on a second surface of the substrate.

The electro-mechanical wave device may comprise a plurality of actuators, such as 4, 8, 12, 16, 20, 24, 32, 36, 42, 48, 96, 192 or more actuators. Preferably, the number P of actuators is given by the formula:

$$P \geq 4n,$$

where n is the wave number equal to the number of wavelengths of the traveling wave along the propagation path. The formula for the number of actuators is derived from a preferred design, where a first set of actuators having 2n subsets of one or more actuators positioned along the propagation path with a mutual distance of half a wavelength of the traveling wave, such that two adjacent subsets will be positioned at the two antinodes of each wavelength of the traveling wave at two instances over one period of oscillation. A second set of actuators having 2n subsets of one or more actuators is positioned a quarter of a wavelength from respective subsets of the first set of actuators along the propagation path. Preferably, two actuators or a pair of actuators constitute a subset of actuators. However, one, three, four, or more actuators may constitute a subset of actuators. In a preferred embodiment, the number P of actuators is given by P=4nk, where $k \geq 1$ is the number of actuators in a subset of actuators, e.g. k=2, and n is the wave number, e.g. n=3, 6. Preferably, the wave number n is selected such that the electro-mechanical wave device is operated in the ultrasonic frequency range. Preferably, the wave number $n \geq 3$, e.g. n=3, 4, 5, 6, 7, 8 or more and may be selected according to the size of the substrate and/or desired operating parameters.

Having a subset of actuators for each of the 2n antinodes along the propagation path of the traveling wave ensures that only the wave with the wave number n is generated by the first and second sets of actuators. Hence, the risk of excitation of multiple modes is minimized.

In a preferred embodiment, a first set of actuators is connected to a first conductor conducting a first oscillating electrical signal with a first amplitude, frequency, and phase, and to a third conductor constituting a common ground. Further, a second set of actuators is connected to a second conductor conducting a second oscillating electrical signal with a second amplitude, frequency, and phase, and to the third conductor constituting a common ground. Preferably, the first and second amplitudes and frequencies are identical, and the first and second phases are mutually shifted by $\pi/2$ corresponding to the common angular frequency multiplied by the time it takes the traveling wave to travel a quarter of a wavelength.

In another embodiment, wherein the distance between subsets of the first and second sets of actuators is different from a quarter of a wavelength, the phase difference between the first and second electrical signals conducted by the first and second conductors may be adjusted accordingly.

Preferably, the frequency of the electrical signals on the first and second conductors is set close to the natural frequency of a desired mode of the substrate, whereby the amplification at the mechanical resonance is utilized.

In a preferred embodiment, the polarization of the 2n subsets of actuators of the first or second set positioned on the same surface of the substrate is arranged such that the subsets have polarizations, whereby these subsets cooperate in the generation of a traveling wave with the desired wave number n. In another embodiment, where the subsets are not positioned on the same surface of the substrate, the polarization of the actuators may be changed accordingly.

The wave device may comprise a first set and a second set of actuators. Preferably, the first and second sets of actuators are positioned on the first surface of the substrate. Additionally, the wave device may comprise a third set and a fourth set of actuators that may be positioned on the second surface of the substrate.

In a preferred embodiment of the present invention, a first and a second set of 2nk actuators (e.g. k=2, and n=3 or n=6) are positioned on the first surface of the substrate. Further, a third set and a fourth set of 2nk actuators (e.g. k=2, and n=3 or n=6) may be positioned on the second surface of substrate. Preferably, the third set of actuators is positioned opposite the first set of actuators and connected to the second and third conductors. Preferably, the fourth set of actuators is positioned opposite the second set of actuators and connected to the first and third conductors. Thereby may be ensured that the actuators of the first and third sets are working together at the same antinodes, and the actuators of the second and fourth sets are working together at the same antinodes shifted a quarter of the wavelength of the traveling wave.

Each of the piezoelectric actuators may comprise a first and second electrode connected to respective conductors for imposing an electrical field over the piezoelectric actuators. Preferably, the first electrode and the second electrode extend substantially perpendicular to the direction of the mechanical wave generated in the substrate. Preferably, the polarization of respective piezoelectric actuators is substantially parallel to the direction of the mechanical wave generated in the substrate. Hereby, the largest piezoelectric effect of $d_{33}$-mode of the piezoelectric actuator is utilized for generation of the traveling wave.

In one embodiment of the present invention, twelve subsets of actuators are arranged in first and second sets of six subsets of two actuators distributed in the circumferential direction on an annular substrate. Six subsets correspond to a wave number of n=3, thus the first and second sets of actuators will generate a traveling bending wave traveling in the circumferential direction of the substrate with three nodal diameters on the substrate. Preferably, the frequency of the electrical signals on the first and second conductors is set close to the bending mode with zero nodal circles m=0, such that a (0,3) mechanical wave is used. However, the wave device according to the present invention may be adapted to carry a mechanical wave using any suitable mode of the substrate, such as a (m,n)-bending mode of circular or annular substrates, where $n \geq 2$, such as (0,3), (0,4), (0,5), (0,6), (1,3), (1,4), (1,5), or (1,6) may be used depending e.g. on the length of the circumferential propagation path.

The electro-mechanical wave device may be employed in a motor. Accordingly, a motor comprising one or more electro-mechanical wave devices according to the invention and one or more mechanical members positioned in operational contact with the substrate(s) is provided, whereby the elliptical motion of the contact surface of the substrate(s), due to the mechanical wave generated by the actuators, moves the mechanical member(s) in relation to the substrate(s). Preferably, the electro-mechanical wave device(s) is/are in operational contact with the mechanical member(s) via a plurality of teeth on the substrate(s) for defining the contact area, for removing the debris from the wear of the frictional contact, and for increasing the velocity of the moved mechanical member(s). Preferably, the mechanical member(s) is/are moved along at least a part of the propagation path of the mechanical wave on the substrate(s).

The mechanical member(s) may be made of any suitable material, such as a metal, e.g. aluminum, a plastic, or a composite of plastic and glass or carbon fibers.

The motor may comprise any suitable number of electro-mechanical wave devices, such as one, two, three, four, five or more electro-mechanical wave devices. The one or more electro-mechanical wave devices may be stacked.

The plurality of teeth may be formed in the substrate material by, e.g. milling or etching. In another embodiment of the present invention, the plurality of teeth may be fixed to the substrate, e.g. by molding, soldering, gluing, welding, silk-screen printing, depositing, etc. The plurality of teeth may be made of a metal alloy, a ceramic, or a polymer. In yet another embodiment of the present invention, the plurality of piezoelectric ceramic actuators may also function as the teeth with operational contact to the mechanical member(s).

The motor may be a rotating motor comprising one or more annular substrates for propagation of a circumferential mechanical wave(s) for rotation of one or more mechanical members in relation to the substrate(s). The electro-mechanical wave device(s) may function as the stator in the rotating motor, and the mechanical member(s) may function as the rotor in the rotating motor. In another embodiment, the electro-mechanical wave device(s) function(s) as the rotor in the rotating motor, and the mechanical member(s) function(s) as the stator in the rotating motor.

The motor may be a linear motor comprising one or more substrates for propagation of a substantially linear mechanical wave for linear movement of one or more mechanical members in relation to the substrate(s).

The motor may be a curve motor comprising one or more curve-shaped substrates for propagation of a mechanical wave(s) along a predetermined propagation path for movement of one or more mechanical members in relation to the substrate(s) along at least a part of the predetermined propagation path.

In an embodiment of the present invention, a double-sided rotating motor may be provided. The motor may comprise an electro-mechanical wave device according to the present invention, a first mechanical member positioned in operational contact with the first surface of the substrate, e.g. via actuators on the first surface, and a second mechanical member positioned in operational contact with the second surface of the substrate, e.g. via actuators on the second surface, in such a way that motion of the contact surface on each surface of the substrate, due to the mechanical wave generated by the actuators, rotates the mechanical members in relation to the substrate.

In a preferred embodiment of the present invention, a stacked rotating motor is provided, comprising a plurality, e.g. two, three, four, five, ten or more electro-mechanical wave devices that are in operational contact with one or more, such as two, three, four, five, six, eleven or more, mechanical members. One or more of the mechanical members may be in operational contact with two mechanical wave devices and/or one or more of the mechanical wave devices may be in operational contact with two mechanical members. The mechanical members may be mechanically connected by a shaft. The piezoelectric actuators of the mechanical wave devices may be used as teeth in the operational contact between the electro-mechanical wave devices and the mechanical members. One or more disc springs may provide the pre-compression in these contacts. Preferably the motor has a housing that may rotationally support the shaft.

The electro-mechanical wave device according to the present invention may be a part of a printed circuit board (PCB). Accordingly, a PCB comprising an electro-mechanical wave device according to the present invention is provided. The PCB may comprise at least one bridge, e.g. 2, 3, 4, 5, or more bridges, formed by at least one opening in the PCB. The at least one bridge may accommodate at least one conductor from different circuits on the PCB to the electro-mechanical wave device. Preferably, the at least one bridge assists in reducing or substantially eliminating the mechanical vibrations in the part of the PCB that does not form a part of the electro-mechanical wave device.

The PCB may comprise a driver circuit for driving the electro-mechanical wave device. Preferably, the driver circuit is adapted for driving single-layer piezoelectric actuators.

The PCB may further comprise a control circuit for controlling properties and/or function of the electro-mechanical wave device, e.g. by controlling the driver circuit based on feedback from the wave device.

According to the invention, a method of providing an electro-mechanical wave device is provided, comprising:
  providing a substrate with a shape for propagation of a mechanical wave in accordance with a predetermined propagation path,
  determining number and positions of a plurality of actuators on the substrate in accordance with requirements for generation of the mechanical wave,
  providing the substrate with conductors for electrical connection of the actuators, and
  mounting the plurality of actuators on the substrate.

The substrate can be provided with the conductors so that they are arranged to provide the actuators with respective excitation signals. The mounting may comprise mounting the plurality of actuators on the substrate in a predetermined pattern with a robot.

The mounting may comprise fixing the plurality of actuators to the substrate. The plurality of actuators may be fixed to the substrate in any suitable way, such as by soldering, gluing, molding, welding, or silkscreen printing,

BRIEF DESCRIPTION OF THE DRAWINGS

Examples of the present invention will now be described in further detail with reference to the enclosed drawings, in which FIG. 1 schematically shows a front view of one embodiment of an electro-mechanical wave device according to the present invention.

DETAILED DESCRIPTION OF EXAMPLES OF THE INVENTION

The figures are schematic and simplified for clarity, and they just show details which are essential to the understanding of the invention, while other details are left out.

Further scope of applicability of the present invention will become apparent from the description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Figure 1:
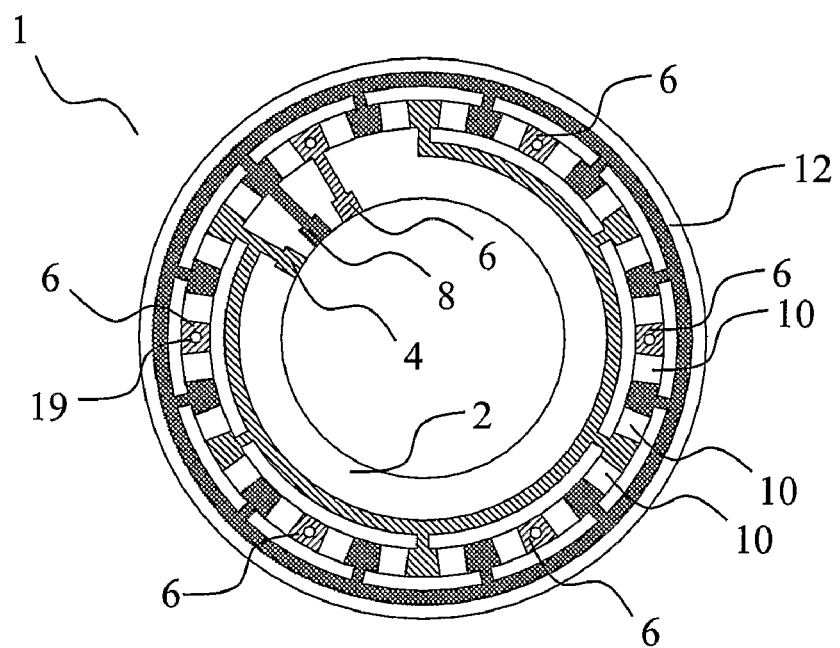

FIG. 1 schematically illustrates an exemplary embodiment of an electro-mechanical wave device according to the invention. The wave device 1 comprises an annular substrate 2, which in the illustrated embodiment is a printed circuit board made of e.g. a glass/epoxy composite or aluminum oxide, for propagation of a mechanical wave and for transmission of electrical signals through conductors 4, 6, 8 accommodated by a first surface 12 of the substrate 2. A first conductor 4 conducts a cosine signal, a second conductor 6 conducts a sine signal, and a third conductor 8 forms the common ground signal connected to respective actuators 10.

Figure 5:
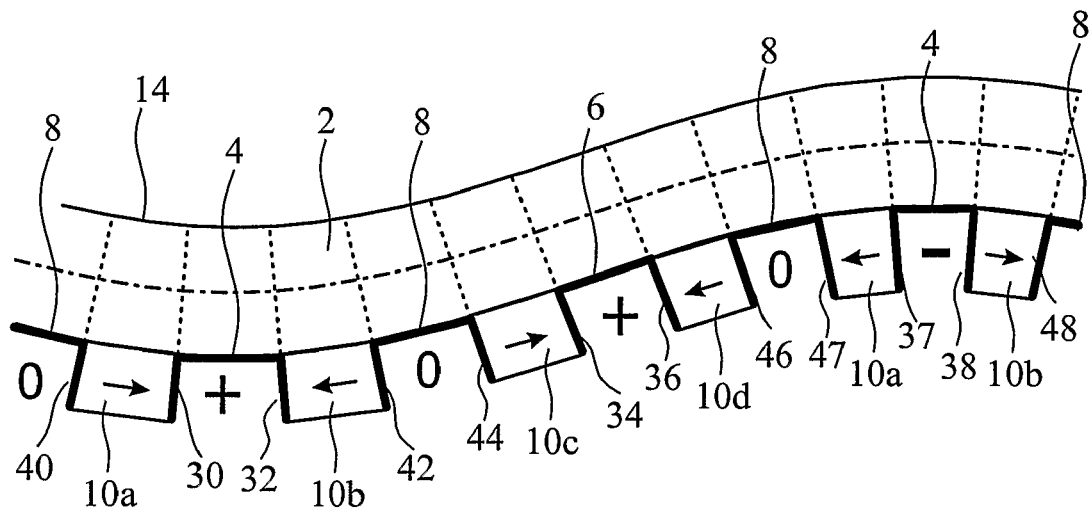
FIG. 5 illustrates mechanical wave propagation in the wave device in FIG. 1.

Piezoelectric actuators 10 are positioned on the first surface 12 of the substrate with their electrodes perpendicular to the surface of the substrate and connected to the respective conductors 4, 6, 8 as shown in more detail in FIG. 5.

Each of the piezoelectric actuators performs a temporal expansion and contraction of the surface, the piezoelectric actuators thereby in cooperation generating a traveling transversal bending wave propagating along the circumferential extension of the substrate 2.

The actuators are substantially evenly distributed around the annular substrate 2. As further explained below, twenty-four piezoelectric actuators 10 are positioned and connected in pairs on the substrate 2 for generation of the circumferential mechanical wave in the substrate 2. The actuators 10 are substantially box-shaped piezoelectric actuators of length 1 mm, width 1 mm, and height 0.5 mm. The shape of the piezoelectric actuators may be selected for maximum efficiency per volume. For example, when the piezoelectric actuators are bonded on the surface of the substrate, only the part of the piezoelectric actuator adjacent the surface is active in the generation of stresses transferred to the substrate and thus the actuators may be of low height. Further, a low height leads to a low area of the electrodes leading to a low capacitance with low driving requirements. Furthermore, a non-cubic shape facilitates mounting of the actuators with automatic equipment. In another embodiment (not shown), the piezoelectric actuators may be embedded in the substrate, e.g. by molding, milling, etc., for improved mechanical coupling between actuators and substrate.

Figure 2:
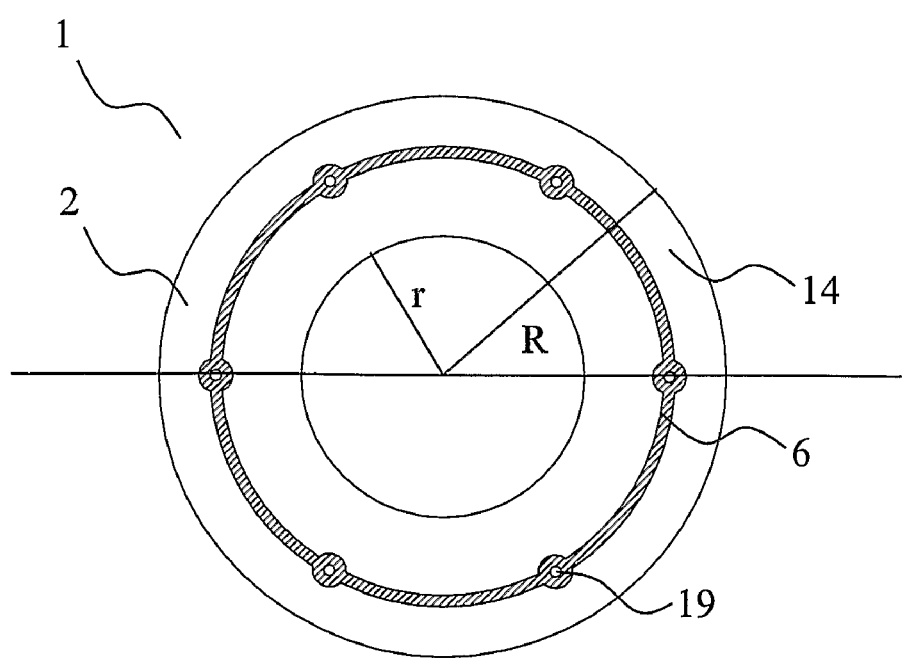
FIG. 2 shows a back view of the electro-mechanical wave device in FIG. 1.

FIG. 2 schematically illustrates a second surface 14 opposite the first surface 12 of the electro-mechanical wave device 1 shown in FIG. 1. The second conductor 6 conducting the sine signal passes from the first surface 12 to the second surface 14 through through-plated holes 19 to the respective electrodes of the piezoelectric actuators. The inner radius r of the annular substrate 2 is about 5 mm, the outer radius R of the annular substrate is about 10 mm, and the thickness is about 1.5 mm.

Figure 3:
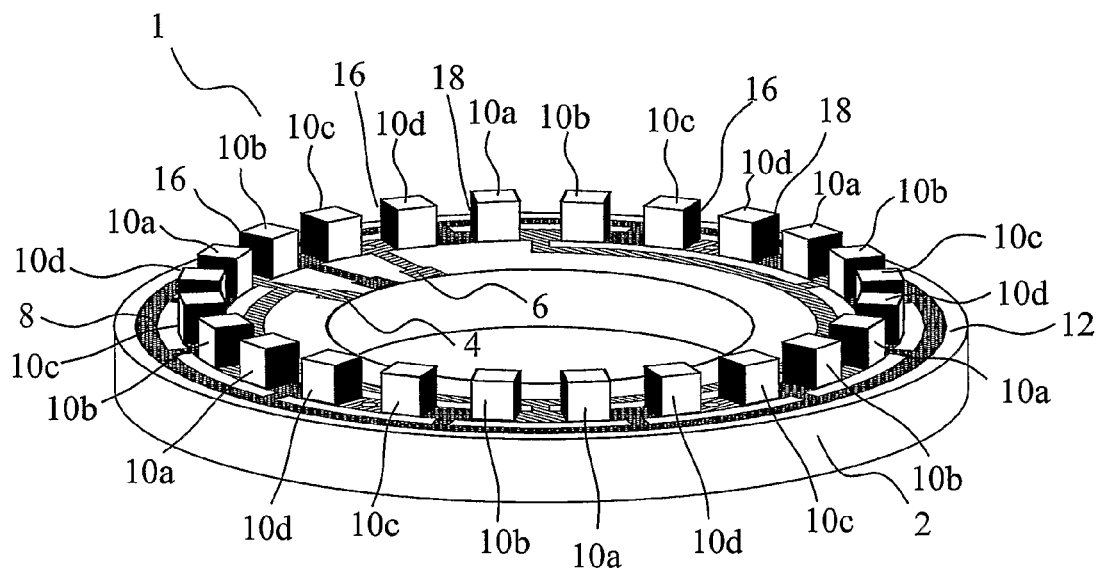
FIG. 3 shows a perspective view of the electro-mechanical wave device in FIG. 1.

FIG. 3 is a perspective view of the electro-mechanical wave device 1 shown in FIGS. 1 and 2. Single layer piezoelectric actuators 10a, 10b, 10c, 10d are mounted on the first surface 12 of the substrate 2. The actuators 10a, 10b are connected in pairs forming a first set of six actuator pairs 10a, 10b, and the actuators 10c, 10d are connected in pairs forming a second set of six actuator pairs 10c, 10d. Actuators 10a, 10b in the first set of actuator pairs have first electrodes 16 that are connected to the first conductor 4 and second electrodes 18 that are connected to the third conductor 8, and actuators 10c, 10d in the second set of actuator pairs have first electrodes 16 that are connected to the second conductor 6 and second electrodes 18 that are connected to the third conductor 8. The first and second electrodes 16, 18 are positioned on respective opposite surfaces of the actuator perpendicular to the surface of the substrate and perpendicular to the direction of propagation of the traveling wave.

Figure 4:
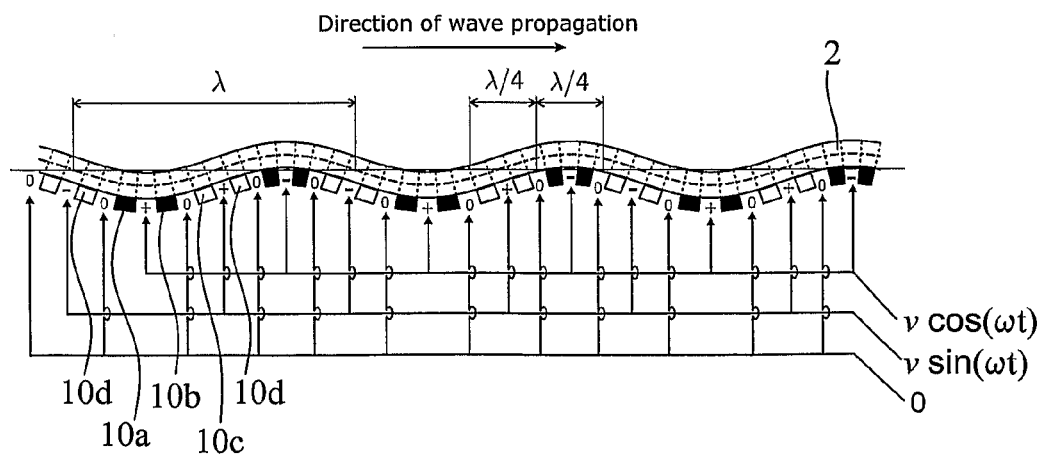
FIG. 4 illustrates mechanical wave propagation in the wave device in FIG. 1.

FIG. 4 shows a circumferential projection of the mechanical wave traveling along a circumferential propagation path in the annular substrate in FIG. 1; the wave amplitude is exaggerated for illustrative purposes. The first conductor 4 conducts the cosine signal $v \cos(\omega t)$ with the voltage amplitude $v$ and the angular frequency $\omega$, the second conductor 6 conducts the sine signal $v \sin(\omega t)$ with the same voltage amplitude $v$ and angular frequency $\omega$, and the third conductor 8 is connected to a ground signal (0). The six piezoelectric actuator pairs 10a, 10b of the first set are polarized such that the three actuator pairs with a plus sign between them expand, and the other three actuator pairs with a minus sign between them contract, when the first conductor 4 conducts a positive electrical signal to their first electrodes connected to the first conductor.

The first set of actuators 10a, 10b will therefore excite a standing wave that has three nodal diameters (n=3) in the annular substrate 2, equivalent to three nodes in the circumferential projection in FIG. 4, and preferably the angular frequency $\omega$ is chosen such that the (0,3)-cosine mode of the annular substrate 2 with zero nodal circles is excited, defined by the transversal deflection at any given point (r,θ) of the annular substrate 2

$$w_1 = a(r,\omega,v)\cos \omega t \cos 3\theta$$

where $a(r,\omega,v)$ is the amplitude of the standing wave at radius r, angular frequency $\omega$, and voltage amplitude $v$.

The six piezoelectric actuator pairs 10c, 10d of the second set are polarized such that the actuator pairs with a plus sign between them expand, and the actuator pairs with a minus sign between them contract, when the second conductor 6 conducts a positive electrical signal to their first electrodes connected to the second conductor.

Likewise, the second set of actuators 10c, 10d will due to the sine signal on the second conductor 6 excite the (0,3)-sine mode of the annular substrate 2, defined by transversal deflection at any given point (r,θ) of the annular substrate 2

$$w_2 = a(r,\omega,v)\sin \omega t \sin 3\theta$$

where a(r,ω,v) is the amplitude of the standing wave at radius r, angular frequency ω, and voltage amplitude v.

The amplitudes and phases of the excited cosine and sine standing waves are substantially equal because the mechanical structure of the device 1 is substantially symmetrical about a rotation axis extending perpendicular to the first surface 12. The two standing waves form the traveling wave by superposition according to the equation $$\begin{aligned} w &= w_1 + w_2 \\ &= a(r,\omega,v)\cos(\omega t)\cos(3\theta) + a(r,\omega,v)\sin(\omega t)\sin(3\theta) \\ &= a(r,\omega,v)\cos(\omega t - 3\theta) \end{aligned}$$

which shows that the wave is traveling forward with the speed ω/3. If the sign of the cosine signal conducted by the first conductor, or the sign of the sine signal conducted by the second conductor is changed then the wave will travel in the opposite direction.

FIG. 5 shows a section of FIG. 4; the wave amplitude is exaggerated for illustrative purposes. The actuators 10a, 10b, 10c, 10d have the first electrodes 30, 32, 34, 36, 37, 38 and second electrodes 40, 42, 44, 46, 47, 48. The first electrodes and the second electrodes extend substantially perpendicular to the direction of the mechanical wave generated in the substrate 2. The first electrodes 30, 32, 37, 38 of the first set of actuator pairs 10a, 10b are connected to the first conductor 4, and the first electrodes 34, 36 of the second set of actuator pairs 10c, 10d are connected to the second conductor 6. The second electrodes 40, 42, 44, 46, 47, 48 are connected to the third conductor 8. The arrows show the direction of polarization of the respective piezoelectric actuators. The actuators of an actuator pair are polarized in opposite directions, towards the plus signs and away from the minus signs.

Figure 6:
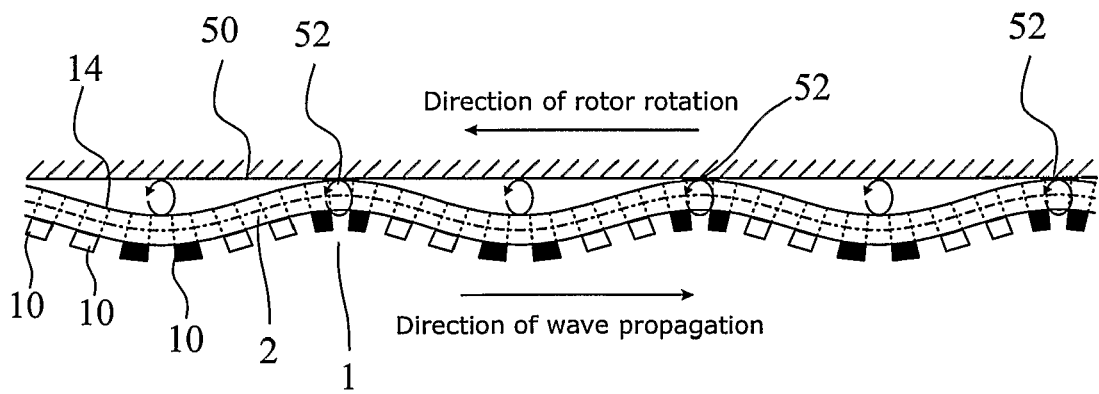
FIG. 6 illustrates a mechanical member being moved by a mechanical wave device.

FIG. 6 shows a circumferential projection that illustrates a circular or annular mechanical member 50 being in operational contact with parts of the second surface 14 of the substrate 2 of the mechanical wave device 1 in such a way that the elliptic motion of the contact surface 52, due to the mechanical wave generated by the actuators 10, rotates the mechanical member 50 in relation to the substrate 2 by friction. The wave amplitude is exaggerated for illustrative purposes. The maximum circumferential velocity of the contact points on the crests of the traveling wave is $$v_{max} = la\omega n/r_c$$

where l is the distance from the neutral bending plane of the annular substrate 2 to the contact surface 52, $r_c$ is the radius of the contact points, the wave number n=3 in the present embodiment, and the amplitude a=a($r_c$,ω,v) of the traveling wave at radius $r_c$. The maximum rotation speed of the member 50 is therefore $$\Omega_{max} = la\omega n/r_c^2$$

thus, the rotational speed of the member 50 may be controlled by regulating the angular frequency ω, the voltage amplitude v and/or the phase between the two standing waves.

Figure 7:
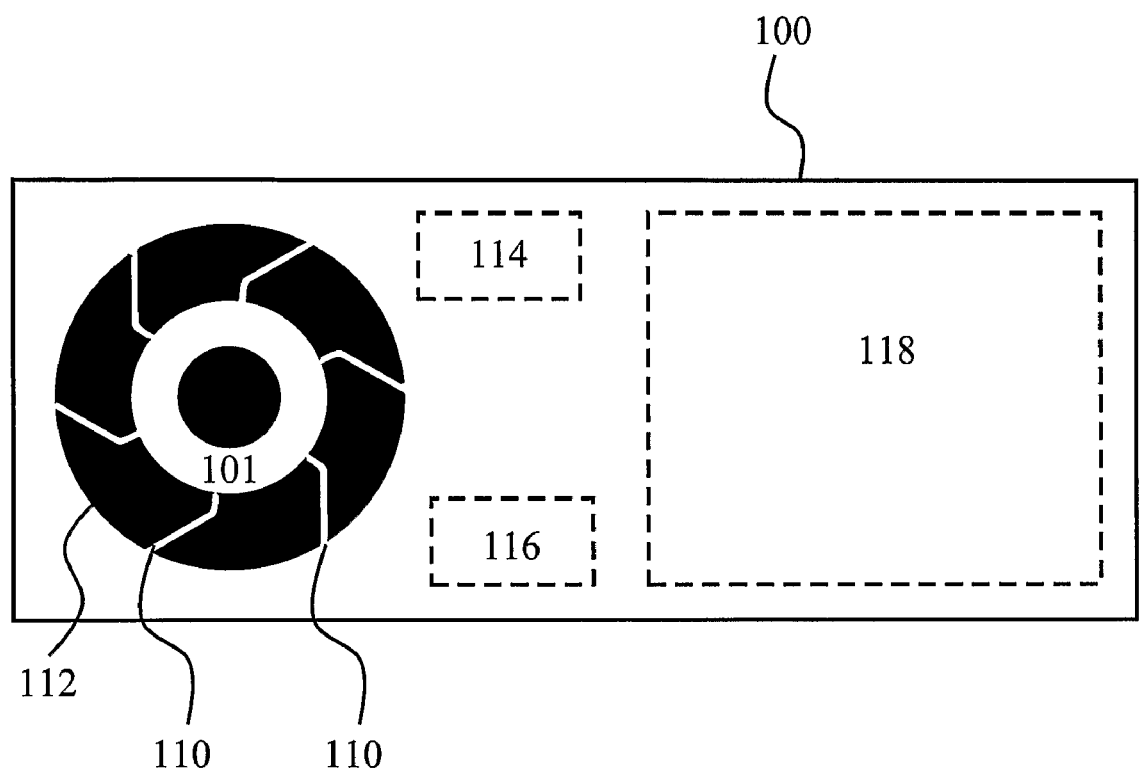
FIG. 7 illustrates a printed circuit board (PCB) comprising an electro-mechanical wave device according to the invention.

FIG. 7 illustrates a printed circuit board (PCB) 100 comprising an electro-mechanical wave device 101 according to the invention. The PCB 100 comprises six bridges 110 formed by six openings 112 in the PCB. One or more of the bridges 110 accommodate one or more conductors from different circuits on the PCB to the electro-mechanical wave device 101. The bridges 110 function as vibration isolation, such that the mechanical vibrations in the mechanical wave device 101 are substantially prevented from propagating in the rest of the PCB 100, and such that the traveling wave in the wave device 101 can travel with minimum influence from the surrounding PCB.

The PCB comprises a driver circuit 114 for driving the electro-mechanical wave device and a control circuit 116 for controlling the electro-mechanical wave device 101, e.g. controlling the driver circuit 114 based on one or more feedback signals from the wave device 101. Application electronics 118 of a particular application that utilizes the electro-mechanical wave device 101 may also be mounted on the PCB 100. In another embodiment, the driver circuit 114 and/or the control circuit 116 is integrated in the application electronics 118.

Figure 8:
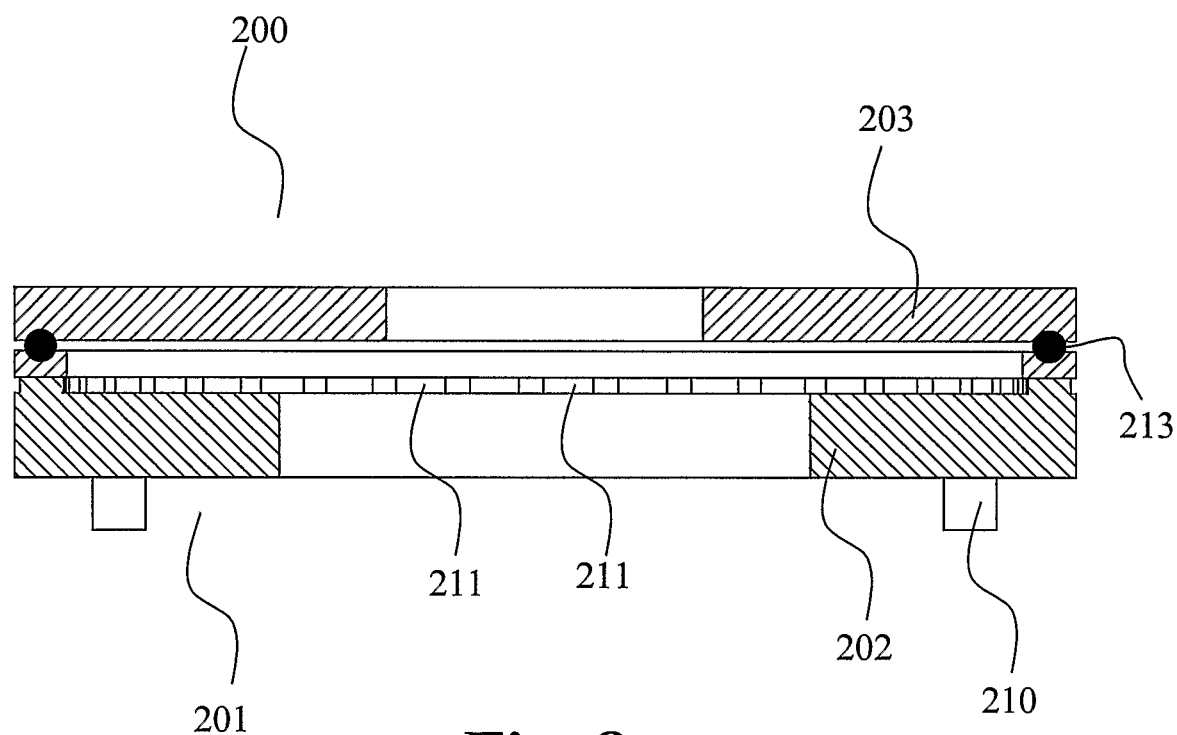
FIG. 8 illustrates a rotating motor according to the invention.

FIG. 8 illustrates a schematic cross-section of one embodiment of a rotating motor 200 according to the present invention. The electro-mechanical wave device 201 is in operational contact with the mechanical member 203 and rotates the mechanical member 203. The electro-mechanical wave device 201 is described above in connection with FIG. 1-5 having a substrate 202 with a plurality of actuators 210 for generation of a traveling wave in the substrate 202. Further, a plurality of teeth 211 is formed in the substrate 202. A viscoelastic member 213, such as an O-ring, is provided in the mechanical member 202 to attenuate vibrations in the mechanical member 204.

Figure 9:
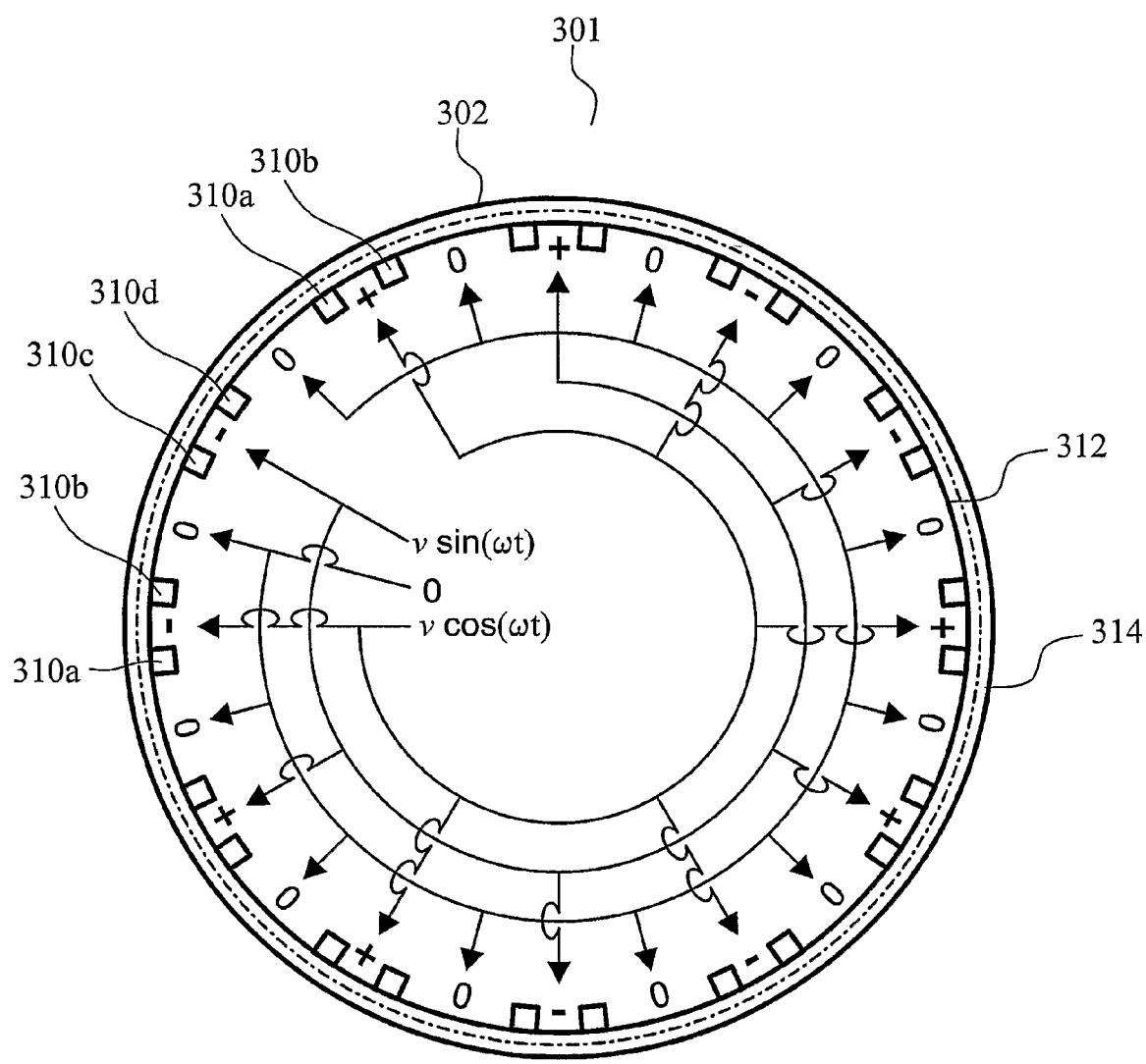
FIG. 9 illustrates another embodiment of an electro-mechanical wave device according to the invention.

FIG. 9 illustrates another embodiment of the electro-mechanical wave device 301 according to the present invention, which is similar to the embodiment shown in FIGS. 1-5. The annular substrate 2 shown in FIGS. 1-5 is here substituted by a cylindrical substrate 302. Typically, the cylindrical substrate 302 has an outer diameter in the range from about 10 mm to about 100 mm, wall thicknesses in the range from about 0.5 mm to about 5 mm, and cylinder heights of about 1 mm to about 10 mm. The two sets of six actuator pairs 310a, 310b, 310c, 310d are positioned on the inner surface 312 of the cylinder with symmetry and polarization similar to the actuator pairs 10a, 10b, 10c, 10d in FIGS. 1-5. The two sets of actuator pairs generate a circumferentially traveling radial bending wave (similar to the circumferentially traveling transversal bending wave in the substrate 2 of the first embodiment shown in FIG. 4) due to the applied cosine and sine electrical signals transmitted to the actuators by three conductors (not shown) similar to the first, second, and third conductors 4, 6, 8 in FIGS. 1-3.

Figure 10:
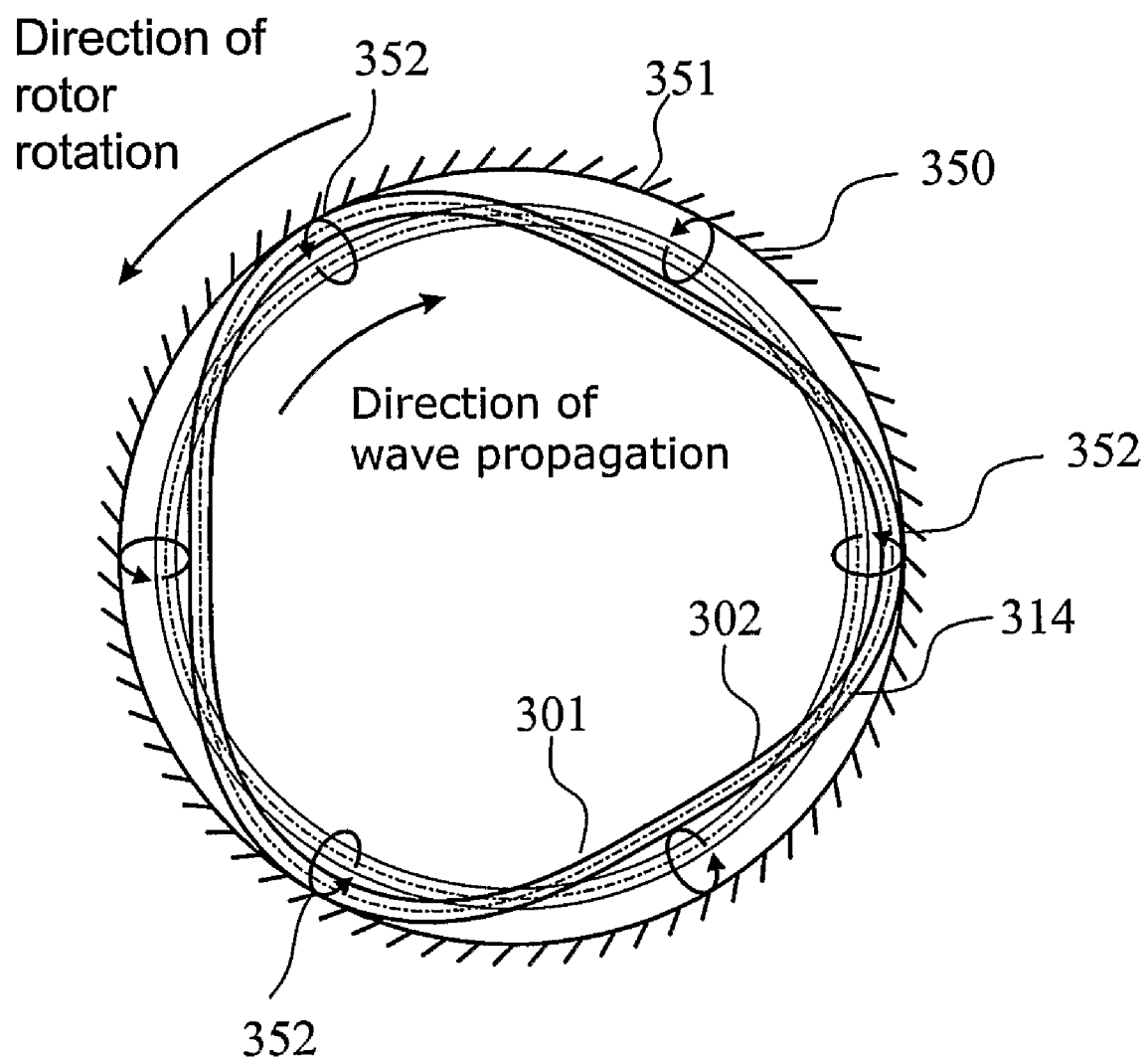
FIG. 10 illustrates one embodiment of a motor according to the present invention.

FIG. 10 shows a schematic cross-section of a cylindrical wave device 301 with a mechanical member 350 having a cylindrical inner surface 351 being in operational contact with parts of the second surface 314 of the substrate 302 in such a way that the elliptic motion of the contact surface 352, due to the mechanical wave generated by the actuators 310, rotates the mechanical member 350 in relation to the substrate 302 by friction.

Figure 11:
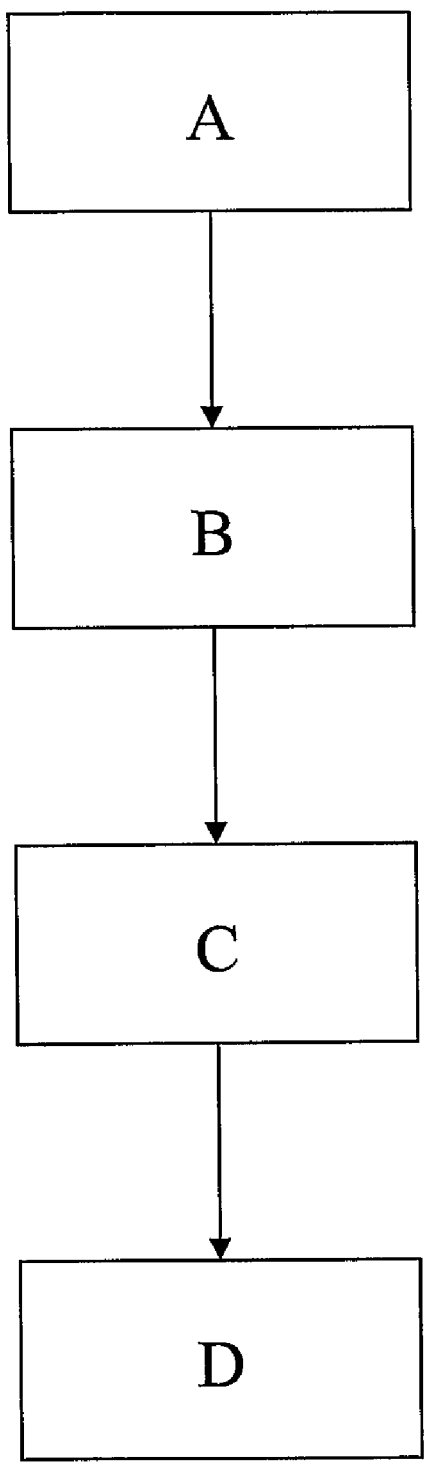
FIG. 11 illustrates one embodiment of the method according to the present invention.

FIG. 11 illustrates one embodiment of the method according to the invention. In the shown embodiment, step A comprises determining the shape of a substrate for propagation of the mechanical wave in accordance with a predetermined propagation path, step B comprises determining number and positions of a plurality of actuators on the substrate in accordance with generation of a mechanical traveling wave along the predetermined propagation path, step C comprises providing the substrate with conductors for electrical connection of the actuators with respective excitation signals, and step D comprises mounting the plurality of actuators on the substrate. In the shown embodiment, step D further comprises placing the plurality of actuators on the substrate in a predetermined pattern with a robot. Furthermore, step D comprises fixing the plurality of actuators to the substrate by e.g. soldering, and/or gluing. In another embodiment of the method according to the invention, the steps A and B are interchanged.

Figure 12:
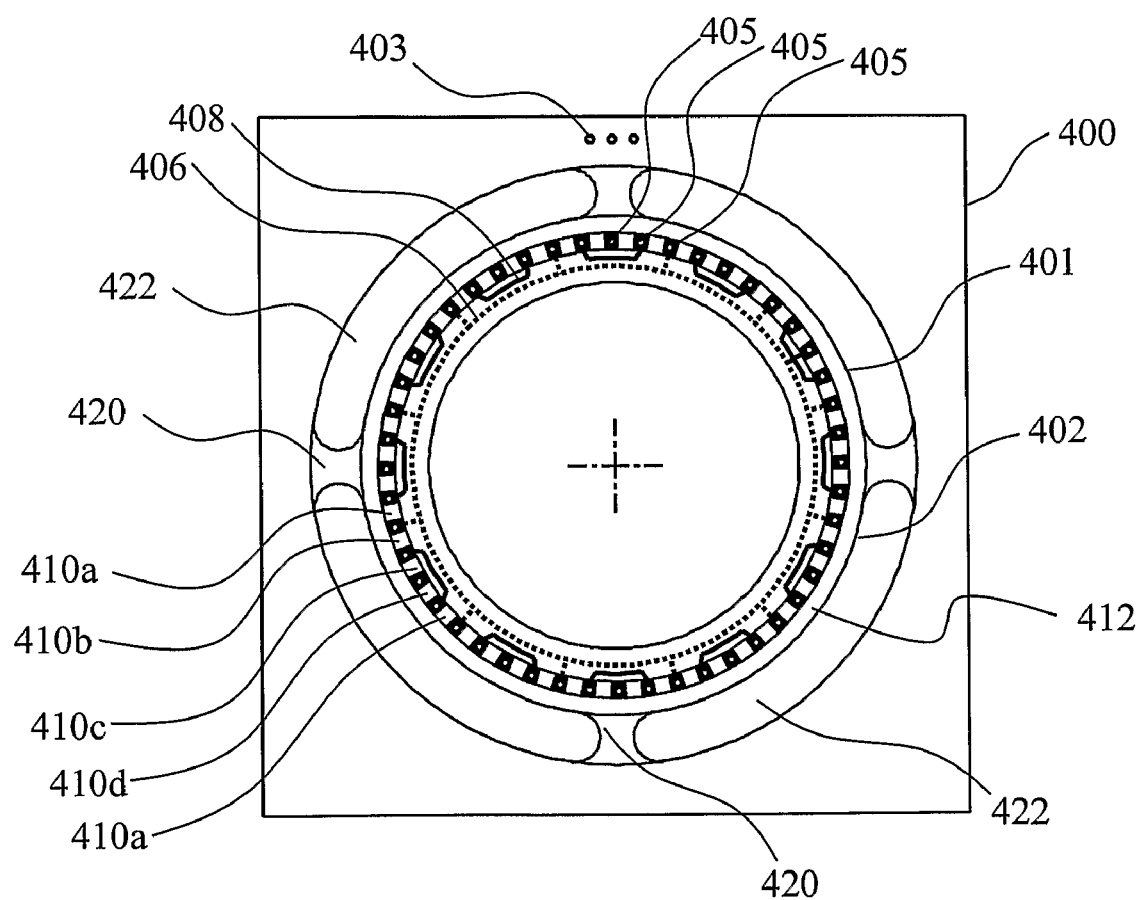
FIG. 12 illustrates a first surface of a printed circuit board (PCB) comprising an electro-mechanical wave device according to the invention.
Figure 13:
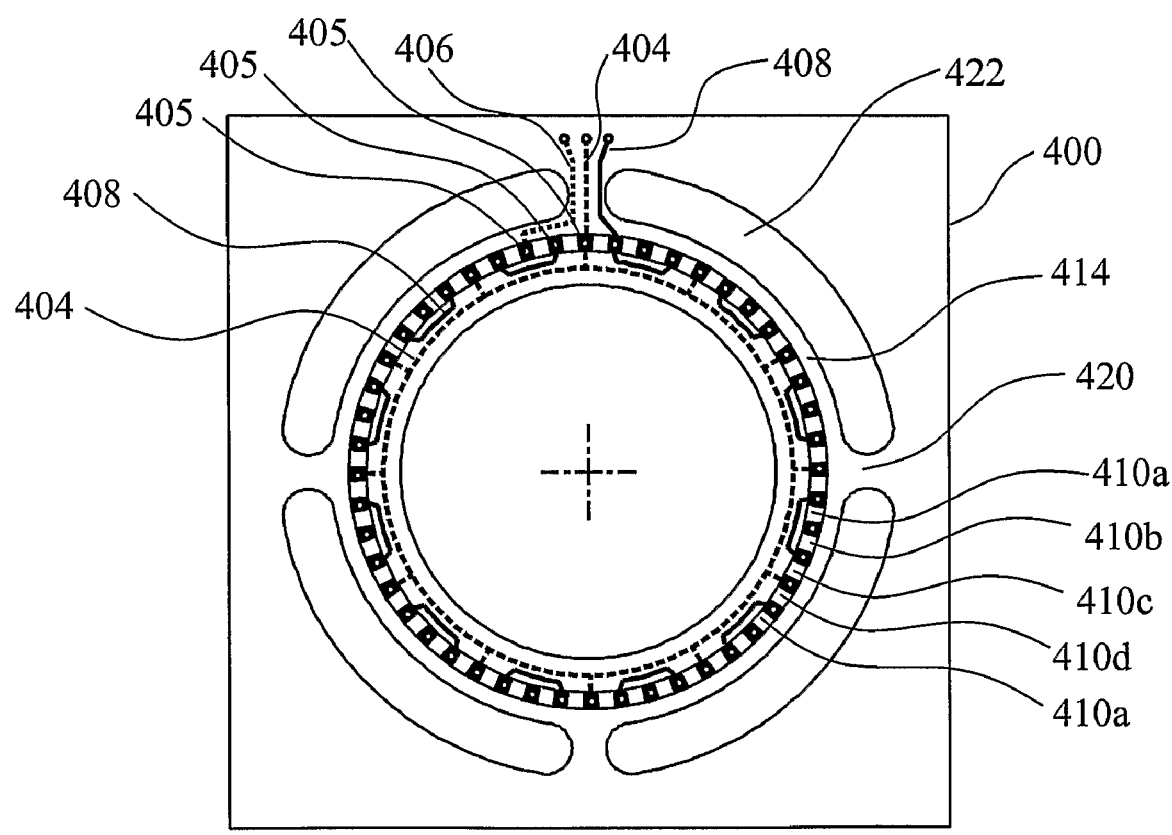
FIG. 13 illustrates a second surface of the printed circuit board in FIG. 12.

FIG. 12 and FIG. 13 illustrate a first surface and a second surface, respectively, of a printed circuit board (PCB) 400 comprising an electro-mechanical wave device 401 with piezoelectric actuators on both surfaces according to the invention. The PCB 400 comprises four bridges 420 formed by four openings 422 in the PCB. One of the bridges accommodates three conductors 404, 406, 408 from three through-plated terminals 403 on the PCB to the electro-mechanical wave device 401. The wave device 401 comprises an annular substructure 402 of the PCB 400 for propagation of a mechanical wave and for transmission of electrical signals through the conductors 404, 406, 408 accommodated by the first surface 412 and the second surface 414 of the substructure 402. The material thickness of the bridges 420 are reduced by e.g. milling to function as vibration isolation between the substructure 402 and the rest of the PCB 400. The preferred inner and outer radii of the annular substructure 402 may be similar to the preferred sizes of the substrate 2 in FIG. 2.

In the wave device 401, ninety-six piezoelectric actuators 410 are bonded to the annular substructure 402 with forty-eight actuators (a first set of actuators comprising twenty-four actuators and a second set of actuators comprising twenty-four actuators) positioned on the first surface 412 and forty-eight actuators (a third set of actuators comprising twenty-four actuators and a fourth set of actuators comprising twenty-four actuators) positioned on the second surface 414. The piezoelectric actuators 410 are working together in pairs (i.e. k=2), whereby the wave number of the traveling mechanical wave is six (i.e. n=6). The preferred shapes and sizes of the actuators 410 may be similar to the preferred shapes and sizes of the actuators 10 in FIG. 1.

As shown in more detail in FIG. 1-5 for an electro-mechanical wave device with actuators on a single surface, a first conductor 404 conducts a cosine signal to a first set of piezoelectric actuators 410a, 410b, a second conductor 406 conducts a sine signal to a second set of piezoelectric actuators 410c, 410d, and a third conductor 408 forms the common ground signal connected to all piezoelectric actuators 410. Through-plated holes 405 at the terminals between the actuators 410 conduct the signal of the first conductor 404 from the first surface 412 to the second surface 414, and conduct the signal of the second conductor 406 from the second surface 414 to the first surface 412. The common ground signal is conducted in a zigzag pattern between the first surface 412 and the second surface 414 through the through-plated holes 405.

To ensure that a piezoelectric actuator on the first surface 412 is contracting when the opposite piezoelectric actuator on the second surface 414 is expanding, these opposite piezoelectric actuators have the opposite polarization.

Figure 14:
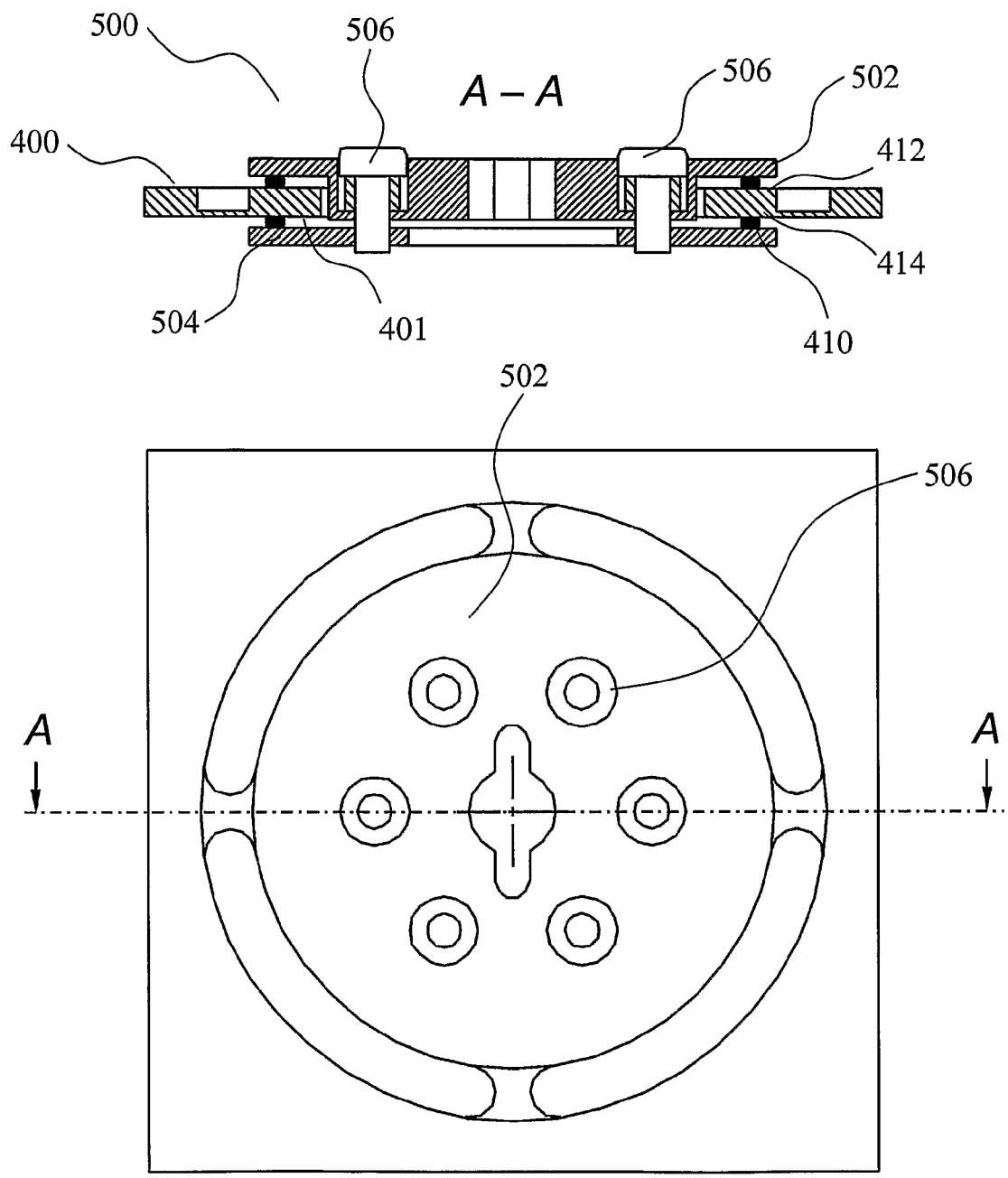
FIG. 14 illustrates an embodiment of a rotating motor according to the invention.

FIG. 14 illustrates a schematic cross-section and a top view of an embodiment of a rotating motor 500 according to the invention. The rotating motor is double-sided, and comprises a printed circuit board (PCB) 400 as illustrated in FIG. 12 comprising an electro-mechanical wave device 401 that is in operational contact with the first mechanical member 502 on the first surface and in operational contact with the second mechanical member 504 on the second surface of the electro-mechanical wave device 401 and rotates the mechanical members 502 and 504 which are mechanically connected by bolts 506 or any other suitable connectors or engagement members. The piezoelectric actuators 410 are used as teeth in the operational contact between the electro-mechanical wave device 401 and the mechanical members 502 and 504.

Figure 15:
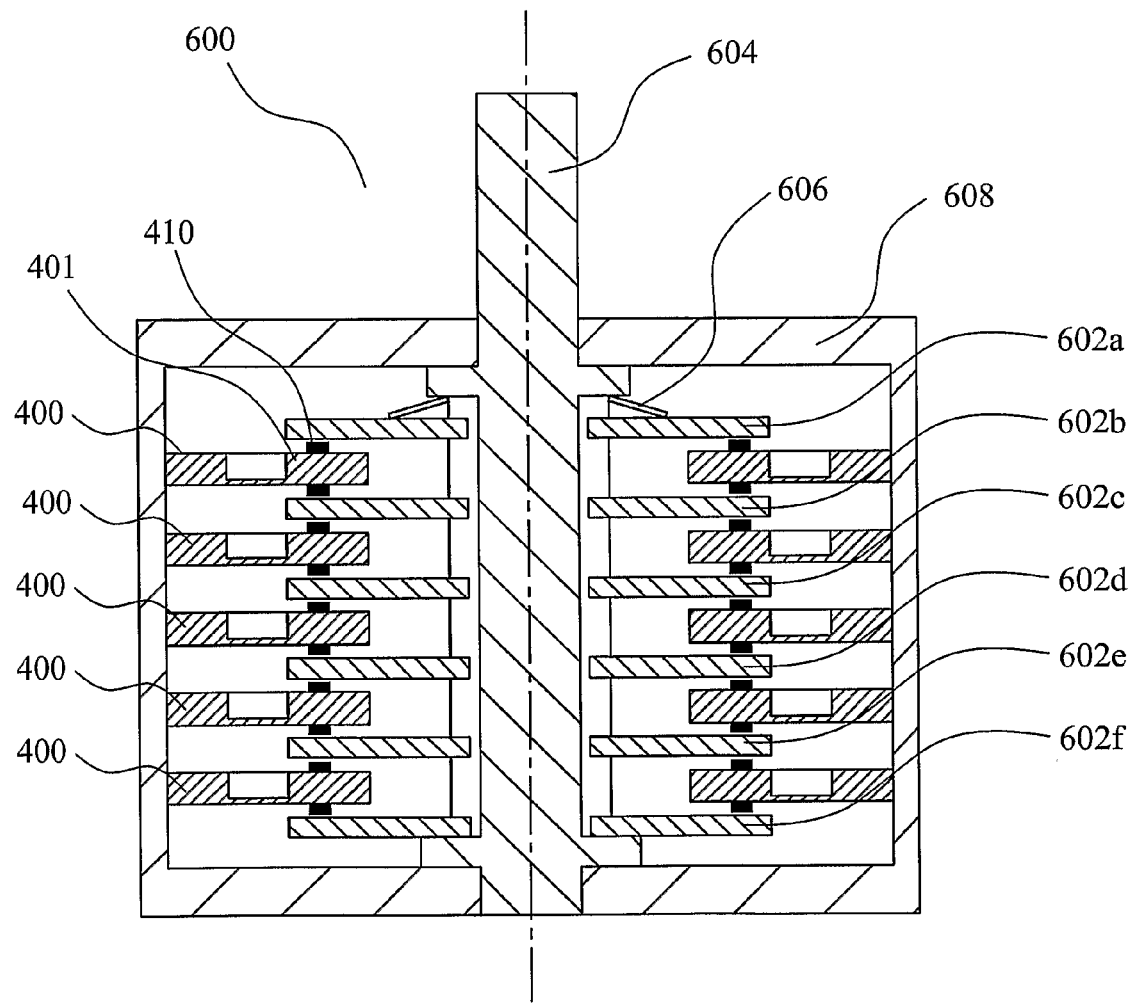
FIG. 15 illustrates an embodiment of a rotating motor according to the invention.

FIG. 15 illustrates a schematic cross-section of an embodiment of a stacked rotating motor 600 according to the invention. Five printed circuit boards (PCBs) 400 as illustrated in FIG. 12 comprising five electro-mechanical wave devices 401 that are in operational contact with six mechanical members 602a-f on each side of the electro-mechanical wave devices 401 and adapted to rotate the mechanical members 602a-f. The mechanical members 602a-f are mechanically connected by the shaft 604. Each electro-mechanical wave device 401 is in operational contact with two mechanical members. The piezoelectric actuators 410 are used as teeth in the operational contact between the electro-mechanical wave devices 401 and the mechanical members 602a-f, where a disc spring 606 provides the pre-compression in these contacts. The mechanical members may additionally be mechanically connected by bolts or any other suitable connectors or engagement members as illustrated in FIG. 14. The shaft is rotationally supported by the housing 608 of the stacked rotating motor 600. Further, the housing 608 accommodates and supports the PCB's 400.

The invention claimed is:

1. An electro-mechanical wave device comprising
a plurality of conductors;
a substrate configured with the plurality of conductors positioned thereon; and
a plurality of actuators, wherein the plurality of actuators are positioned on the substrate, wherein each of the actuators is connected to at least one of said plurality of conductors, wherein in response to receiving an excitation signal transmitted by at least one of the plurality of conductors, the plurality of actuators generate a mechanical wave that propagates along a predetermined path within the substrate.

2. An electro-mechanical wave device according to claim 1, wherein the actuators are piezoelectric actuators.

3. An electro-mechanical wave device according to claim 1, wherein the actuators are magneto-restrictive actuators.

4. An electro-mechanical wave device according to claim 1, wherein the substrate is annular for propagation of a mechanical wave in the circumference of the substrate.

5. An electro-mechanical wave device according to claim 1, wherein the substrate is cylindrical for propagation of a mechanical wave in the circumference of the substrate.

6. A rotating motor comprising an electro-mechanical wave device according to claim 4, and a mechanical member positioned in operational contact with a contact surface of the substrate in such a way that motion of the contact surface of the substrate, due to the mechanical wave generated by the actuators, rotates the mechanical member in relation to the substrate.

7. A double-sided rotating motor comprising an electro-mechanical wave device according to claim 5, a first mechanical member positioned in operational contact with a contact surface of a first surface of the substrate and a second mechanical member positioned in operational contact with a contact surface of a second surface of the substrate in such a way that motion of the contact surfaces of the first and the second surfaces of the substrate, due to the mechanical wave generated by the actuators, rotates the mechanical members in relation to the substrate.

8. A stacked rotating motor comprising two or more electro-mechanical wave devices according to claim 4, and one or more mechanical members positioned in operational contact with contact surfaces of the substrates in such a way that motion of the contact surfaces of the substrates, due to the mechanical waves generated by the actuators, rotates the one or more mechanical members in relation to the substrates.

9. A rotating motor comprising an electro-mechanical wave device according to claim 5, and a mechanical member positioned in operational contact with a contact surface of an inner or an outer surface of the substrate in such a way that the motion of the contact surface of the substrate, due to the mechanical wave generated by the actuators, rotates the mechanical member in relation to the substrate.

10. A printed circuit board comprising an electro-mechanical wave device according to claim 1.

11. A printed circuit board according to claim 10, further comprising a driver circuit for driving the mechanical wave device.

12. A printed circuit board according to claim 10, further comprising a control circuit for controlling properties and/or function of the electro-mechanical wave device.

13. A printed circuit board according to claim 10, further comprising application electronics.

14. A method of providing an electro-mechanical wave device, comprising providing a substrate configured with the plurality of conductors positioned thereon, the substrate being further configure with a shape for propagation of a mechanical wave in accordance with a predetermined propagation path;

determining number and positions of a plurality of actuators on the substrate in accordance with requirements for generation of the mechanical wave;

providing the substrate with conductors for electrical connection of the actuators; and mounting the plurality of actuators on the substrate.

15. A method according to claim 14 wherein the mounting comprises mounting the plurality of actuators on the substrate in a predetermined pattern with a robot.

16. A method according to claim 14 wherein of mounting comprises fixing, the plurality of actuators to the substrate.

17. An electro-mechanical wave device according to claim 1, wherein the actuators are a combination of piezoelectric actuators and magneto-restrictive actuators.

18. An electro-mechanical wave device according to claim 1, wherein the actuators generate the mechanical wave propagating in the substrate along a predetermined propagation path in response to the excitation signals.

19. An electro-mechanical wave device according to claim 1, wherein the substrate comprises a first, a second and a third conductor, with each conductor being connected to one or more of the actuators.

20. An electro-mechanical wave device according to claim 1, wherein each of the actuators being connected to a respective set of said conductors wherein a set of conductors is two conductors, with at least one of said two conductors being arranged to conduct a signal for excitation of said actuator.

21. A rotating motor comprising an electro-mechanical wave device according to claim 1.

* * * * *